United States Patent
Chien et al.

(10) Patent No.: US 11,039,548 B1
(45) Date of Patent: Jun. 15, 2021

(54) FLEXIBLE AIR BAFFLE SUPPORTING DIFFERENT CONFIGURATIONS WITH OPTIMIZED AIR FLOW

(71) Applicant: DELL PRODUCTS L.P., Round Rock, TX (US)

(72) Inventors: Tung Yu Chien, New Taipei (TW); Hsing Yu Chiang, Taipei (TW)

(73) Assignee: DELL PRODUCTS L.P., Round Rock, TX (US)

( * ) Notice: Subject to any disclaimer, the term of this patent is extended or adjusted under 35 U.S.C. 154(b) by 0 days.

(21) Appl. No.: 16/832,710

(22) Filed: Mar. 27, 2020

(51) Int. Cl.
*H05K 7/00* (2006.01)
*H05K 7/20* (2006.01)
*H05K 5/02* (2006.01)

(52) U.S. Cl.
CPC ....... *H05K 7/20145* (2013.01); *H05K 5/0213* (2013.01)

(58) Field of Classification Search
CPC ............. H05K 7/20145; H05K 5/0213; H05K 7/20727
See application file for complete search history.

(56) References Cited

U.S. PATENT DOCUMENTS

| | | | | |
|---|---|---|---|---|
| 5,793,610 A * | 8/1998 | Schmitt | ............. | H05K 7/20581 165/80.3 |
| 6,115,250 A * | 9/2000 | Schmitt | ............. | H05K 7/20727 165/104.34 |
| 6,771,499 B2 * | 8/2004 | Crippen | ............. | G06F 1/20 16/277 |
| 7,535,709 B2 * | 5/2009 | Fan | ............. | G06F 1/20 165/104.33 |
| 7,800,902 B2 * | 9/2010 | Della Fiora | ........ | H05K 7/20145 361/679.48 |
| 7,830,659 B2 * | 11/2010 | Liu | ............. | G06F 1/181 361/690 |
| 8,035,970 B2 * | 10/2011 | Schott | ............. | H05K 7/20736 361/695 |
| 8,199,498 B2 | 6/2012 | Wang et al. | | |
| 8,437,133 B2 | 5/2013 | Bhutani et al. | | |
| 9,570,824 B1 | 2/2017 | Chien et al. | | |
| 9,640,910 B1 | 5/2017 | Chien et al. | | |
| 9,703,331 B1 | 7/2017 | Chien et al. | | |
| 9,887,474 B2 | 2/2018 | Chien et al. | | |
| 9,915,983 B2 | 3/2018 | Yu et al. | | |
| 10,079,449 B1 | 9/2018 | Chien et al. | | |
| 10,624,233 B1 * | 4/2020 | Huang | ............. | H05K 7/20554 |
| 10,631,427 B1 | 4/2020 | Chien et al. | | |
| 2004/0100765 A1 * | 5/2004 | Crippen | ............. | H05K 7/20718 361/679.48 |
| 2008/0117589 A1 * | 5/2008 | Carrera | ............. | G06F 1/20 361/679.51 |
| 2008/0310103 A1 * | 12/2008 | Della Fiora | ........ | H05K 7/20145 361/690 |

(Continued)

*Primary Examiner* — Kimberley S Wright
(74) *Attorney, Agent, or Firm* — Jackson Walker LLP; Christopher J. Rourk

(57) ABSTRACT

A chassis is disclosed that includes a first sidewall, a second sidewall and a baffle having a plurality of penetrations, a first side and a second side and configured to be inserted into the chassis between the first sidewall and the second sidewall. An air block is disposed in each penetration, wherein each air block can be selectably configured in either a closed position to prevent air flow or an open position to allow air flow.

20 Claims, 5 Drawing Sheets

(56) References Cited

U.S. PATENT DOCUMENTS

| | | | |
|---|---|---|---|
| 2010/0157521 A1* | 6/2010 | Liu | G06F 1/181 361/679.46 |
| 2011/0053485 A1* | 3/2011 | Huang | H05K 7/20145 454/184 |
| 2011/0128697 A1* | 6/2011 | Schott | H05K 7/20181 361/679.46 |
| 2013/0163199 A1* | 6/2013 | Chen | H05K 7/20145 361/690 |
| 2020/0060042 A1* | 2/2020 | Liu | H05K 7/20718 |

* cited by examiner

FLEXIBLE AIR BAFFLE SUPPORTING DIFFERENT CONFIGURATIONS WITH OPTIMIZED AIR FLOW

TECHNICAL FIELD

The present disclosure relates generally to equipment chassis and more specifically to a flexible air baffle supporting different configurations with optimized air flow.

BACKGROUND OF THE INVENTION

Design of air flow pathways in an equipment chassis is time-consuming and often requires equipment modifications in the field to accommodate minor design variations.

SUMMARY OF THE INVENTION

A chassis is disclosed, such as a housing for electronic equipment, that includes a first sidewall, a second sidewall and a baffle having a plurality of penetrations. The baffle also has a first side and a second side, and is configured to be inserted into the chassis between the first sidewall and the second sidewall. An air block is disposed in each of the penetrations of the baffle, and each air block can be selectably configured in either a closed position to prevent air flow or an open position to allow air flow.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF THE SEVERAL VIEWS OF THE DRAWINGS

Aspects of the disclosure can be better understood with reference to the following drawings. The components in the drawings may be to scale, but emphasis is placed upon clearly illustrating the principles of the present disclosure. Moreover, in the drawings, like reference numerals designate corresponding parts throughout the several views, and in which.

DETAILED DESCRIPTION OF THE INVENTION

Figure 1:
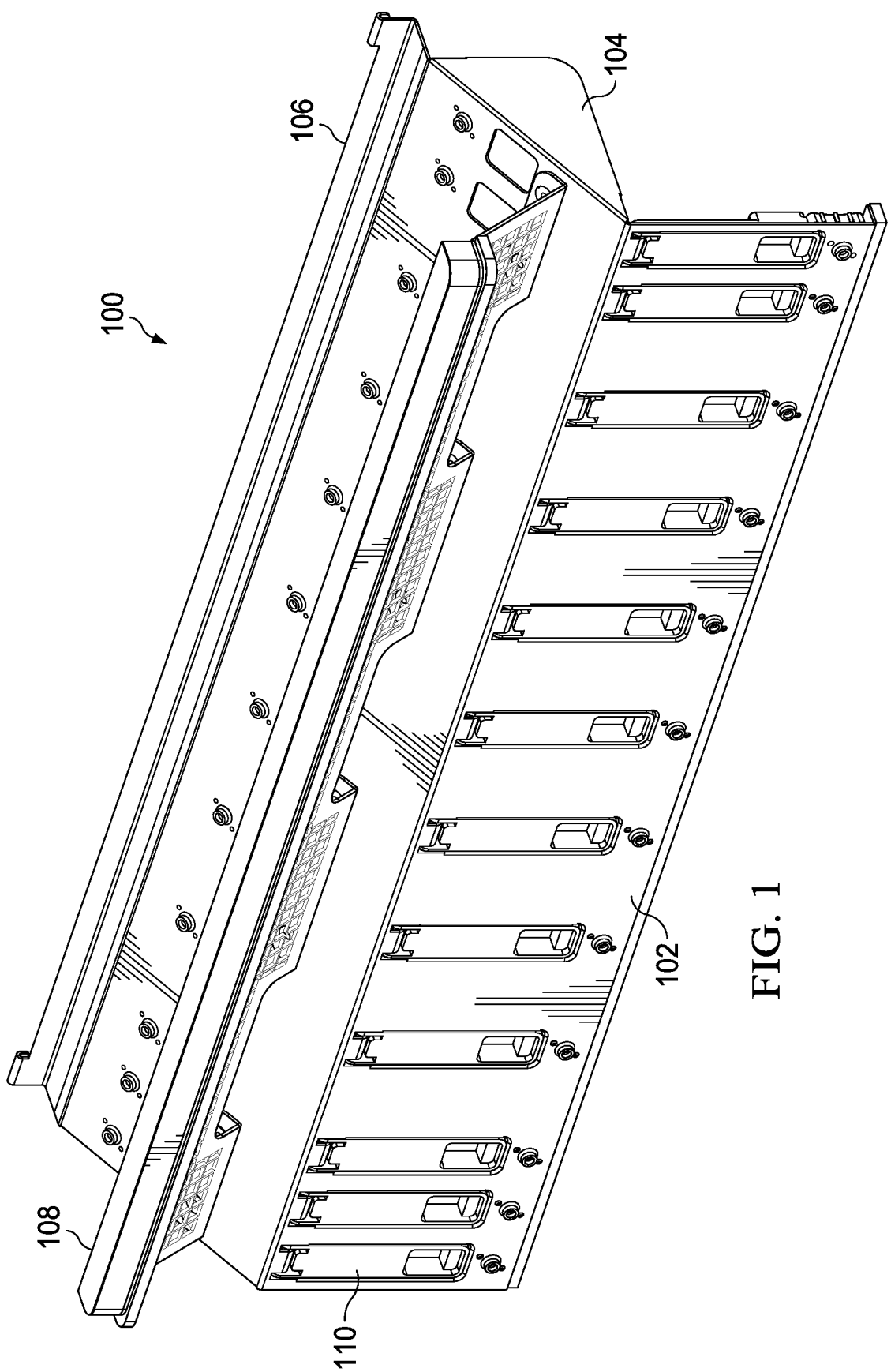
FIG. 1 is a diagram of an air baffle assembly, in accordance with an example embodiment of the present disclosure.

In the description that follows, like parts are marked throughout the specification and drawings with the same reference numerals. The drawing figures may be to scale and certain components can be shown in generalized or schematic form and identified by commercial designations in the interest of clarity and conciseness.

A chassis platform can support a variable number of card assemblies, such as one to ten double width/full height (DWFH) cards, or other suitable configurations. However, when less than ten DWFH cards are installed in the available slots, the one or more single-piece air block features may need to be installed, to prevent air flow from bypassing a design air flow pathway. Similar problems can also occur with single width, half height (SWHH) cards, where existing air block features do not fit within the smaller form factor for those cards, which can result in problems with air flow being bypassed.

The present disclosure provides an integrated device with multiple air blocks installed in an air baffle hold bracket. Each air block can have a door that can be rotated and flexibly adjusted based on the specific configuration, such as where different numbers of card supports are used, and can optimize the air flow to prevent the air flow bypassed. The present disclosure can also be used to provide a reconfigurable sub-window or sub-penetration on each air block for optimizing air flow management, such as with a gate that can slide or latch, which can provide the flexibility to increase air flow for critical downstream components in selected configurations.

The prior solutions used multiple pieces of equipment, such as dummy blanks in the downstream air channels, multiple air baffles in the upstream air channels, a holding bracket on top of all cards to prevent cards popping-up during shipping and other equipment. Such equipment-intensive solutions work, but increase the complexity required at the factory to fabricate and configure the equipment as a function of the number of cards installed.

FIG. 1 is a diagram of an air baffle assembly 100, in accordance with an example embodiment of the present disclosure. Air baffle assembly 100 includes air baffle 102, angle support 104, rear support 106, air baffle hold bracket 108 and air blocks 110, each of which can be fabricated as separate parts, as of a larger assembly, from compression molded plastic, injection molded plastic, sheet metal, punched metal or in other suitable manners from other suitable materials.

Air baffle assembly 100 as shown includes 12 air blocks 110, including three on the left hand side that are spaced close together, seven in the middle that are spaced farther apart and two on the right hand side that are spaced close together. Air baffle assembly can include other suitable numbers of air blocks 110 with other suitable spacing, and can be sized to have a width, height, depth or other dimensions as needed to fit within a chassis.

Air baffle 102 provides a frame for the components of air baffle assembly 100, including holes for air blocks 110, connection points for angle support 104, rear support 106 and air baffle hold bracket 108, latch points and other suitable features. Air baffle 102 can be used to define the width of air baffle assembly 100, the number of spaces for air blocks 110 and other suitable features.

Angle support 104 can be a formed component of air baffle 102, can be a separate item that is attached to air baffle 102 by welding, epoxy, bolts, rivets or in other suitable manners, or can be otherwise suitably constructed. Angle support 104 can be used to brace air baffle assembly 100 within the chassis, for structural stability of air baffle assembly 100 or for other suitable purposes.

Rear support 106 can be attached to air baffle 102 or can be an extended part of air baffle 102, and is used to couple air baffle 102 to the chassis. In one example embodiment, rear support 106 can be configured to mechanically clip onto a portion of air baffle 102 and/or the chassis, but rivets, adhesives, bolts, welds, epoxy or other suitable mechanisms can be used to secure rear support 106 to air baffle 102 and/or the chassis. In another example embodiment, a universal connection mechanism such as a double-sided adhesive strip can be used to secure rear support 106 to air baffle 102 and/or the chassis, or other suitable configurations can also or alternatively be used.

Air baffle hold bracket 108 can be attached to air baffle 102 or can be an extended part of air baffle 102, and is used to couple air baffle 102 to the chassis. In one example embodiment, air baffle hold bracket 108 can be configured to mechanically clip onto a portion of air baffle 102 and/or the chassis, but rivets, adhesives, bolts, welds, epoxy or other suitable mechanisms can be used to secure rear support 106 to air baffle 102 and/or the chassis. In another example embodiment, a universal connection mechanism such as a double-sided adhesive strip can be used to air baffle hold bracket 108 to air baffle 102 and/or the chassis, or other suitable configurations can also or alternatively be used.

Air blocks 110 can be disposed in air baffle 102 and can be used to block the flow of air through penetrations in air baffle 102 that would otherwise be used to hold a circuit board card or other suitable components. In one example embodiment, air blocks 110 can be individual components that are secured in a hole or penetration of air baffle 102, such as by using a mechanical clip, a fastener, a rivet, a bolt, adhesives, epoxy or in other suitable manners. Air blocks 110 can also or alternatively be configured to allow an adjustable amount of air to flow through, where suitable. As discussed further herein, each air block can be placed in multiple positions, such as by including a door that rotates on a hinge, by including a slideable gate in each door that allows a reduced air flow to be achieved by placing the gate in a first position and which allows a total air flow blockage to be achieved by placing the gate in a second position, or in other suitable manners.

In operation, air baffle assembly 100 allows an air baffle to be used that can be readily reconfigured to accommodate changes in the number of cards or other suitable components that are disposed within a chassis. Air baffle assembly 100 prevents disruptions to the air flow path that would otherwise be caused by providing for a large number of penetrations or other devices to allow the number of circuit board cards or other suitable components from being varied in response to customer requirements, design requirements or for other suitable purposes, and eliminates the need for individual devices that are bulky and inefficient.

Figure 2:
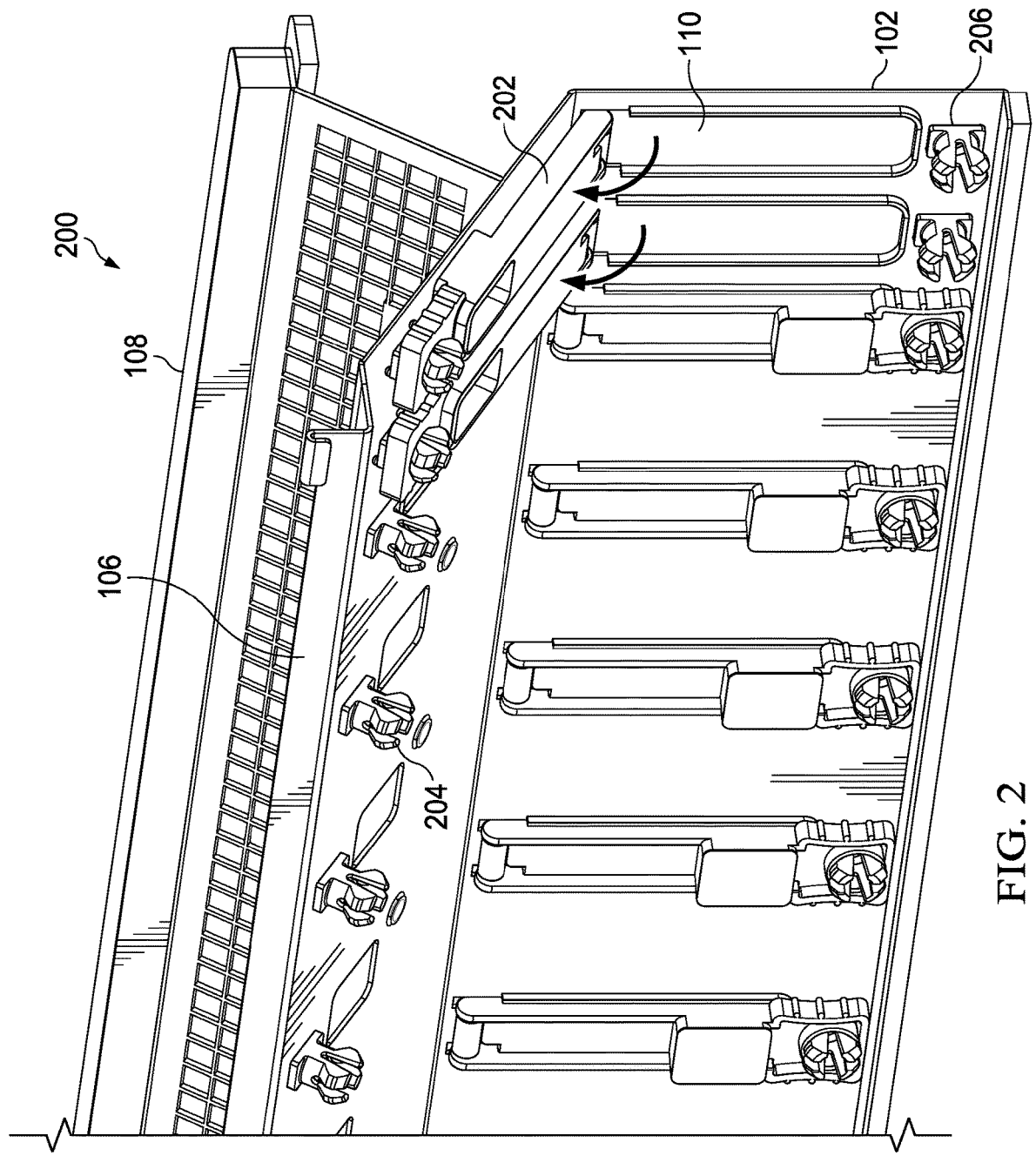
FIG. 2 is a diagram of a detail of an air baffle assembly, in accordance with an example embodiment of the present disclosure.

FIG. 2 is a diagram of a detail 200 of air baffle assembly 100, in accordance with an example embodiment of the present disclosure. Detail 200 includes doors 202, upper connectors 204 and lower connectors 206, which can be fabricated from metal, injection molded plastic, compression molded plastic, rubber or other suitable materials.

Doors 202 are configured to swivel on a hinge, a flexible plastic connector or some other mechanism to allow the penetration in air blocks 110 to be opened or closed. In one example embodiment, doors 202 can be secured in an open position using an upper connector 204, and can be secured in a closed position using a lower connector 206, or other suitable mechanisms can also or alternatively be used.

Upper connectors 204 can be secured to air baffle 102 using an adhesive, a mechanical clip or in other suitable manners. In one example embodiment, upper connectors 204 can be latching-type mechanical connectors that can be used to releasably hold one of doors 202 in an open position. A penetration can be disposed adjacent to upper connector 204 to accommodate a slideable knob in a closed position, an open position or in other suitable manners. For example, if the penetration only accommodates a knob in a closed position, the use will place the knob in the closed position prior to securing the associated door 202 in an open position.

Lower connectors 206 can be secured to air baffle 102 using an adhesive, a mechanical clip or in other suitable manners. In one example embodiment, lower connectors 206 can be latching-type mechanical connectors that can be used to releasably hold one of doors 202 in an open position.

In operation, detail 200 shows an example implementation of how air blocks 110 can be used to allow a circuit card or other suitable component to be added or removed without requiring expensive and time consuming modifications to the air baffles of a chassis. Detail 200 should be understood as an example of such mechanisms, and other suitable mechanisms can also or alternatively be used.

Figure 3:
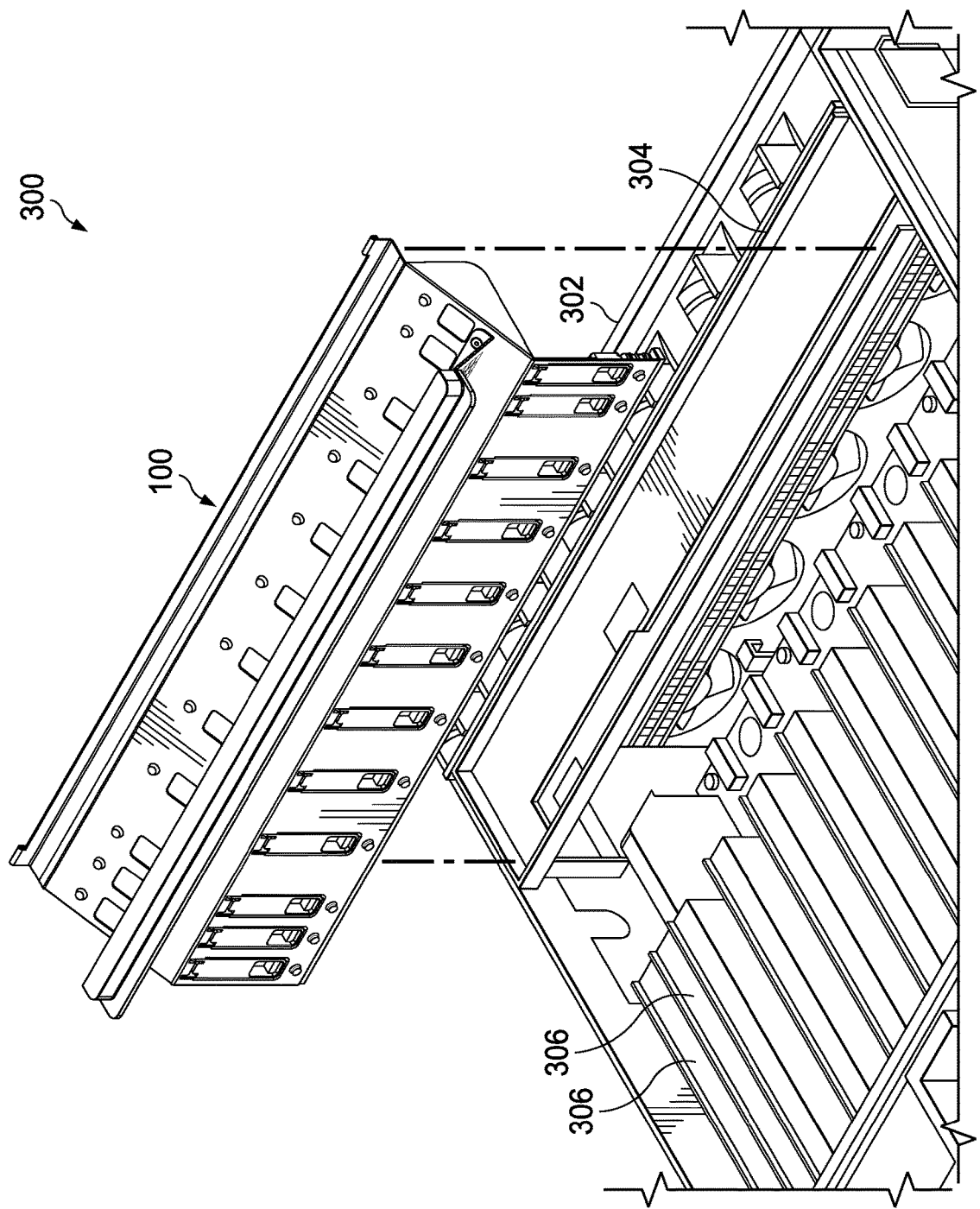
FIG. 3 is a diagram of an air baffle assembly being inserted into a chassis, in accordance with an example embodiment of the present disclosure.

FIG. 3 is a diagram of air baffle assembly 100 being inserted into a chassis 300, in accordance with an example embodiment of the present disclosure. Chassis 300 includes chassis front 302, support structure 304 and circuit cards 306, which are described in greater detail below.

Chassis front 302 can be fabricated from metal, plastic or other suitable materials that are commonly used to form an electrical equipment chassis. In one example embodiment, chassis front 302 can be a portion of an entire chassis fabrication component, such as a frame, a "bucket" or other suitable components. Chassis front 302 can be used to hold one or more fans that are used to force cooling air through the chassis.

Support structure 304 can be used to clip rear support 106 of air baffle assembly 100 onto, such as a cross-brace that is secured to chassis front 302 or other portions of the chassis. In one example embodiment, support structure can be a lateral support that is disposed between two sidewalls of the chassis that is provided primarily for the purpose of supporting rear support 106 of air baffle assembly 100, or can be provided for other suitable purposes and configured to also provide support to rear support 106.

Circuit cards 306 are contained within the chassis and are cooled by the fans held in chassis front 302. Circuit cards 306 align with the air blocks 110 of air baffle assembly 100, such that air blocks 110 need to be configured in an open position to allow cooling air to flow through or across each of the circuit cards 306. In one example embodiment, circuit cards 306 can include dummy cards that do not require cooling, and air blocks 110 can remain in a closed position for such dummy cards.

In operation, chassis 300 is configured to allow air baffle assembly 100 or other suitable components to be used to control variations in the air flow path created by minor modifications to the circuit cards or other components contained within chassis 300. Chassis 300 includes internal support structures such as support structure 304 and circuit cards that are configured to interconnect with air blocks 110 of air baffle assembly 100, or other suitable components.

Figure 4A:
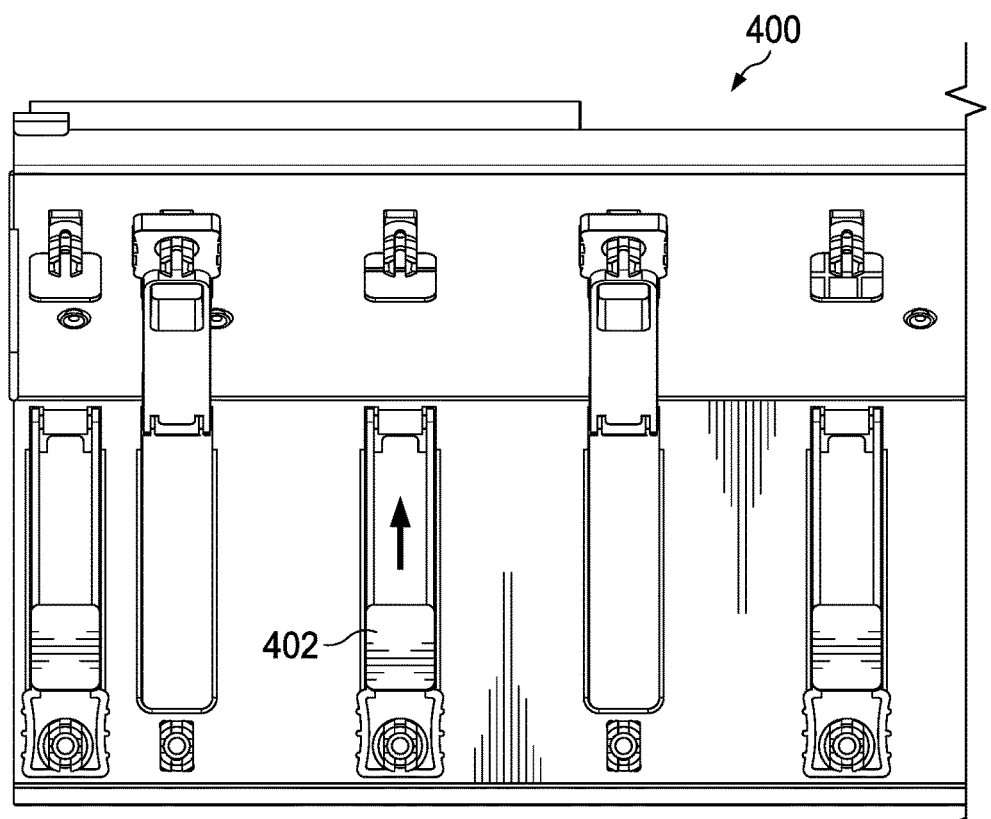
FIGS. 4A and 4B are detail diagrams an air gate in a closed and open position, respectively, in accordance with an example embodiment of the present disclosure.
Figure 4B:
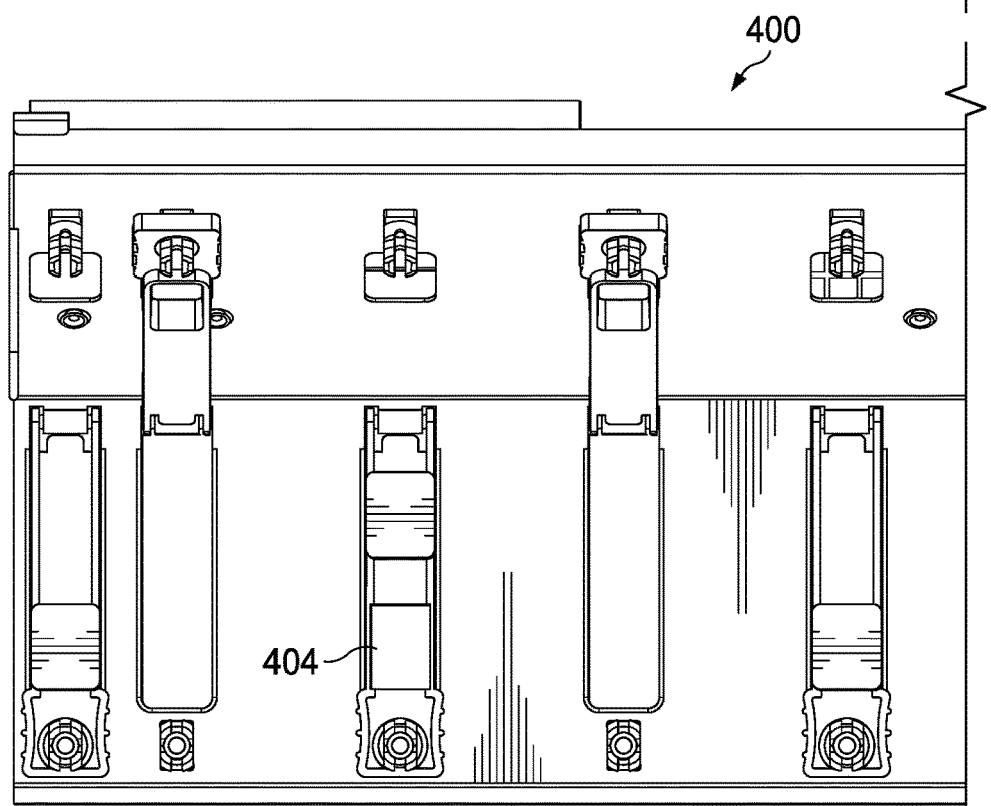

FIGS. 4A and 4B are detail diagrams 400 of an air gate of a door 202 in a closed position 402 and an air gate of a door 202 an open position 404, respectively, in accordance with an example embodiment of the present disclosure. The air gate can be formed from metal, plastic or other suitable materials, and can be configured to block air flow in closed position 402, to allow air flow in open position 404, and to provide other suitable functions. In one example embodiment, the air gate can have a knob that can be moved by a user to allow the user to slide the air gate, such as by disposing the knob in opposing grooves along either side of air block 110, one or more latches, clips or other mechanical devices can be used to secure the air gate in a first and second position, or other suitable features can also or alternatively be used. A sub-penetration can be exposed when the knob is slid into a first position, and the sub-penetration can be covered by the knob when it is slid into a second position.

Figure 5:
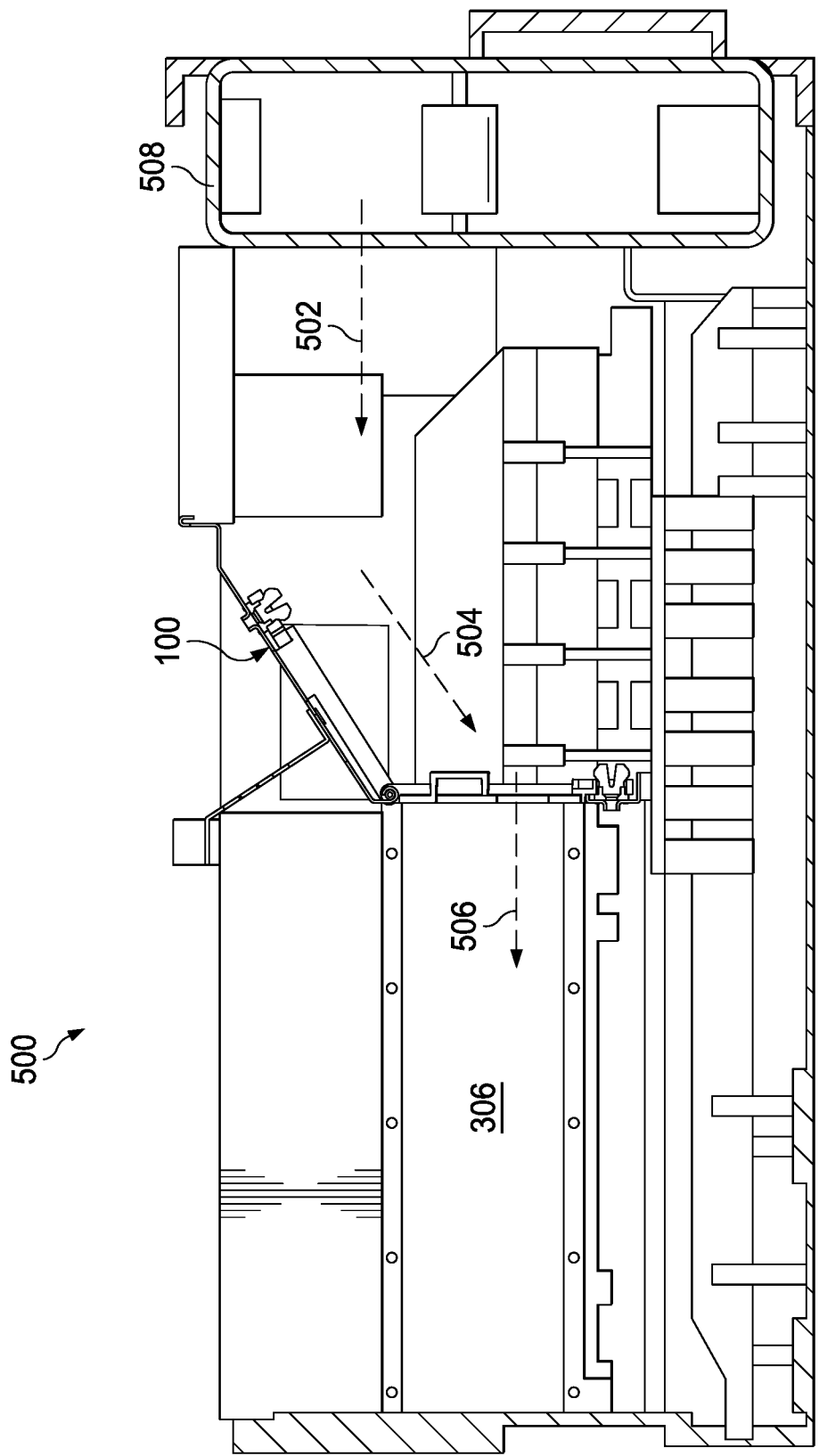
FIG. 5 is a diagram of a chassis with an air baffle assembly installed, in accordance with an example embodiment of the present disclosure.

FIG. 5 is a diagram of a chassis 500 with air baffle assembly 100 installed, in accordance with an example embodiment of the present disclosure. Chassis 500 includes air flow path 502 through a fan assembly 508, air flow path 504 along air baffle 102, and air flow path 506 out from open air blocks 110 and into circuit cards 306. In this manner, the designed air flow path can be maintained by closing air gates or doors 202 of air blocks 110, which eliminates the need for installation or modification of components within chassis 500.

As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. As used herein, phrases such as "between X and Y" and "between about X and Y" should be interpreted to include X and Y. As used herein, phrases such as "between about X and Y" mean "between about X and about Y." As used herein, phrases such as "from about X to Y" mean "from about X to about Y."

As used herein, "hardware" can include a combination of discrete components, an integrated circuit, an application-specific integrated circuit, a field programmable gate array, or other suitable hardware. As used herein, "software" can include one or more objects, agents, threads, lines of code, subroutines, separate software applications, two or more lines of code or other suitable software structures operating in two or more software applications, on one or more processors (where a processor includes one or more microcomputers or other suitable data processing units, memory devices, input-output devices, displays, data input devices such as a keyboard or a mouse, peripherals such as printers and speakers, associated drivers, control cards, power sources, network devices, docking station devices, or other suitable devices operating under control of software systems in conjunction with the processor or other devices), or other suitable software structures. In one exemplary embodiment, software can include one or more lines of code or other suitable software structures operating in a general purpose software application, such as an operating system, and one or more lines of code or other suitable software structures operating in a specific purpose software application. As used herein, the term "couple" and its cognate terms, such as "couples" and "coupled," can include a physical connection (such as a copper conductor), a virtual connection (such as through randomly assigned memory locations of a data memory device), a logical connection (such as through logical gates of a semiconducting device), other suitable connections, or a suitable combination of such connections. The term "data" can refer to a suitable structure for using, conveying or storing data, such as a data field, a data buffer, a data message having the data value and sender/receiver address data, a control message having the data value and one or more operators that cause the receiving system or component to perform a function using the data, or other suitable hardware or software components for the electronic processing of data.

In general, a software system is a system that operates on a processor to perform predetermined functions in response to predetermined data fields. A software system is typically created as an algorithmic source code by a human programmer, and the source code algorithm is then compiled into a machine language algorithm with the source code algorithm functions, and linked to the specific input/output devices, dynamic link libraries and other specific hardware and software components of a processor, which converts the processor from a general purpose processor into a specific purpose processor. This well-known process for implementing an algorithm using a processor should require no explanation for one of even rudimentary skill in the art. For example, a system can be defined by the function it performs and the data fields that it performs the function on. As used herein, a NAME system, where NAME is typically the name of the general function that is performed by the system, refers to a software system that is configured to operate on a processor and to perform the disclosed function on the disclosed data fields. A system can receive one or more data inputs, such as data fields, user-entered data, control data in response to a user prompt or other suitable data, and can determine an action to take based on an algorithm, such as to proceed to a next algorithmic step if data is received, to repeat a prompt if data is not received, to perform a mathematical operation on two data fields, to sort or display data fields or to perform other suitable well-known algorithmic functions. Unless a specific algorithm is disclosed, then any suitable algorithm that would be known to one of skill in the art for performing the function using the associated data fields is contemplated as falling within the scope of the disclosure. For example, a message system that generates a message that includes a sender address field, a recipient address field and a message field would encompass software operating on a processor that can obtain the sender address field, recipient address field and message field from a suitable system or device of the processor, such as a buffer device or buffer system, can assemble the sender address field, recipient address field and message field into a suitable electronic message format (such as an electronic mail message, a TCP/IP message or any other suitable message format that has a sender address field, a recipient address field and message field), and can transmit the electronic message using electronic messaging systems and devices of the processor over a communications medium, such as a network. One of ordinary skill in the art would be able to provide the specific coding for a specific application based on the foregoing disclosure, which is intended to set forth exemplary embodiments of the present disclosure, and not to provide a tutorial for someone having less than ordinary skill in the art, such as someone who is unfamiliar with programming or processors in a suitable programming language. A specific algorithm for performing a function can be provided in a flow chart form or in other suitable formats, where the data fields and associated functions can be set forth in an exemplary order of operations, where the order can be rearranged as suitable and is not intended to be limiting unless explicitly stated to be limiting.

It should be emphasized that the above-described embodiments are merely examples of possible implementations.

Many variations and modifications may be made to the above-described embodiments without departing from the principles of the present disclosure. All such modifications and variations are intended to be included herein within the scope of this disclosure and protected by the following claims.

What is claimed is:

1. A chassis comprising:
   a first sidewall;
   a second sidewall;
   a baffle having a plurality of penetrations, a first side and a second side and configured to be inserted into the chassis between the first sidewall and the second sidewall; and
   an air block disposed in each penetration, wherein each air block can be selectably configured in either a closed position to prevent air flow or an open position to allow air flow;
   wherein each air block further comprises a door of the air block configured to be locked in an open position to allow air flow through the air block in the closed position and a closed position to prevent air flow through the air block in the closed position.

2. The chassis of claim 1 wherein each penetration further comprises a clip configured to hold the door of the air block in the open position.

3. The chassis of claim 1 wherein each penetration further comprises a clip configured to hold the door of the air block in the closed position.

4. The chassis of claim 1 wherein the baffle further comprises a rear support disposed along a top side, the rear support configured to secure the baffle to the chassis.

5. The chassis of claim 1 wherein the baffle further comprises a rear support disposed along a top side, the rear support configured to secure the baffle to a lateral support of the chassis with one or more clips.

6. The chassis of claim 1 wherein the baffle further comprises a hold bracket coupled to a surface of the baffle between the first side and the second side with one or more clips.

7. The chassis of claim 1 wherein the baffle further comprises a hold bracket having a first end coupled to a surface of the baffle between the first side and the second side and a second end coupled to the chassis with one or more clips.

8. The chassis of claim 1 wherein the baffle further comprises a first group of penetrations having a first spacing and a second group of penetrations having a second spacing.

9. The chassis of claim 1 wherein the baffle further comprises a first group of penetrations having a first spacing and a second group of penetrations having a second spacing, wherein the first spacing is different from the second spacing.

10. The chassis of claim 1 wherein each penetration further comprises a clip configured to mechanically hold the door of the air block in the open position.

11. The chassis of claim 1 wherein each penetration further comprises a clip configured to hold the door of the air block in the closed position.

12. The chassis of claim 1 wherein each door comprises a gate that can be selectably placed in either an open position to allow air flow or a closed position to prevent air flow.

13. The chassis of claim 1 wherein each air block further comprises a gate that can be selectably placed in either an open position to allow air flow or a closed position to prevent air flow, and the baffle includes a penetration associated with each of the gates.

14. The chassis of claim 1 wherein the baffle includes a second penetration associated with each of the first penetrations.

15. The chassis of claim 1 wherein the baffle includes a second penetration associated with each of the air blocks.

16. The chassis of claim 1 wherein the baffle includes a second penetration associated with the door of each of the air blocks.

17. The chassis of claim 1 wherein the baffle includes a second penetration associated with a gate of the door of each of the air blocks.

18. The chassis of claim 1 wherein the baffle includes a second penetration associated with an open position of a gate of the door of each of the air blocks.

19. The chassis of claim 1 wherein the baffle includes a second penetration associated with a closed position of a gate of the door of each of the air blocks.

20. A chassis comprising:
   a baffle having one or more penetrations;
   an air block disposed in each penetration, wherein each air block can be selectably configured in either a closed position to prevent air flow or an open position to allow air flow; and
   a door of the air block configured to be locked in an open position to allow air flow through the air block in the closed position and a closed position to prevent air flow through the air block in the closed position.

* * * * *